(12) United States Patent
Choi et al.

(10) Patent No.: US 8,038,494 B2
(45) Date of Patent: Oct. 18, 2011

(54) ORGANIC ELECTROLUMINESCENT DEVICE AND METHOD OF MANUFACTURING THE SAME

(75) Inventors: Yoon-sun Choi, Yongin-si (KR); Jin-Hwan Kim, Yongin-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 12/629,562

(22) Filed: Dec. 2, 2009

(65) Prior Publication Data
US 2010/0087019 A1    Apr. 8, 2010

Related U.S. Application Data

(62) Division of application No. 11/706,352, filed on Feb. 15, 2007, now Pat. No. 7,667,387.

(30) Foreign Application Priority Data

Jun. 23, 2006 (KR) .................... 10-2006-0057090

(51) Int. Cl.
*H01J 9/22* (2006.01)

(52) U.S. Cl. ............. 445/14; 313/504; 445/11; 445/12; 445/13

(58) Field of Classification Search .......... 313/498–512; 445/11–14
See application file for complete search history.

(56) References Cited

U.S. PATENT DOCUMENTS

| 6,433,487 B1* | 8/2002 | Yamazaki ............ 315/169.3 |
| 7,358,663 B2 | 4/2008 | Chen |
| 2005/0206306 A1* | 9/2005 | Perlo et al. .............. 313/504 |

FOREIGN PATENT DOCUMENTS

KR    10-2003-0072247 A    9/2003

* cited by examiner

*Primary Examiner* — Toan Ton
*Assistant Examiner* — Fatima Farokhrooz
(74) *Attorney, Agent, or Firm* — Sughrue Mion, PLLC

(57) ABSTRACT

An organic electroluminescent device (OELD) and a method of manufacturing the OELD are provided. The OELD includes a substrate, an anode electrode stacked on the substrate, an organic light emitting layer that is stacked on the anode electrode and has a plurality of protrusions on the organic light emitting layer, and a cathode electrode that covers the protrusions formed on the organic light emitting layer and is formed of a metal.

10 Claims, 6 Drawing Sheets

ORGANIC ELECTROLUMINESCENT DEVICE AND METHOD OF MANUFACTURING THE SAME

CROSS-REFERENCE TO RELATED PATENT APPLICATION

This is a divisional of application Ser. No. 11/706,352 filed Feb. 15, 2007. The entire disclosure of the prior application, application Ser. No. 11/706,352, is considered part of the disclosure of the accompanying divisional application and is hereby incorporated by reference. This application claims priority from Korean Patent Application No. 10-2006-0057090, filed on Jun. 23, 2006, in the Korean Intellectual Property Office, the disclosure of which is incorporated herein in its entirety by reference.

BACKGROUND OF THE INVENTION

1. Field of the Invention

The apparatuses and methods consistent with the present invention relate to an organic electroluminescent device (OELD), and a method of manufacturing the OELD, and more particularly, to an OELD that has increased luminance efficiency and lifetime, and a method of manufacturing the OELD.

2. Description of the Related Art

An OELD is a display device that displays images using light emitted from an organic light emitting layer by a combination of holes, supplied from an anode electrode, and electrons, supplied from a cathode electrode, in the organic light emitting layer formed between the anode electrode and the cathode electrode. Due to the excellent display characteristics of the OELD, such as a large viewing angle, high speed response, thinness, low manufacturing costs, and high contrast, the OELD is expected to become one of the next generation flat panel display devices.

FIG. 1 is a cross-sectional view illustrating a related art OELD. Referring to FIG. 1, an anode electrode 12 is formed on a transparent substrate 10 using a transparent conductive material such as indium tin oxide (ITO). An organic light emitting layer 14 is formed on the anode electrode 12 using an organic material, and a cathode electrode 16 is formed on the organic light emitting layer 14 using a metal. In the above structure, when a predetermined voltage is applied between the anode electrode 12 and the cathode electrode 16, visible light is emitted from the organic light emitting layer 14, and visible light displays an image by emitting externally through the anode electrode 12 and the transparent substrate 10. However, in the OELD having the above mentioned structure, a portion of visible light emitted from the organic light emitting layer 14 is not able to pass through interfaces between layers and is lost since the transparent substrate 10, the anode electrode 12, the organic light emitting layer 14, and the cathode electrode 16 having different refractive indexes from each other are stacked in a planar structure. More specifically, there is a drawback in that approximately 40% of visible light emitted from the organic light emitting layer 14 is lost at an interface between the organic light emitting layer 14 and the anode electrode 12 due to a total reflection at the interface, and another 40% of visible light is absorbed by the cathode electrode 16 and absorbed as heat due to a surface plasmon resonance (SPR) phenomenon occurring at a flat interface between the organic light emitting layer 14 and the cathode electrode 16, which is formed of a metal.

SUMMARY OF THE INVENTION

The present invention provides an organic electroluminescent device (OELD) that has increased luminance efficiency and lifetime, and a method of manufacturing the OELD.

According to an aspect of the present invention, there is provided an OELD comprising: a substrate; an anode electrode stacked on the substrate; an organic light emitting layer that is stacked on the anode electrode and has a plurality of protrusions thereon; and a cathode electrode that covers the protrusions formed on the organic light emitting layer and is formed of a metal.

The protrusions may have a pitch of 50 to 600 nm and a height of 50 to 600 nm.

According to an aspect of the present invention, there is provided a method of manufacturing an OELD, comprising: stacking an anode electrode on a substrate; stacking an organic light emitting layer having a plurality of protrusions on the anode electrode; and stacking a cathode electrode formed of a metal on the organic light emitting layer to cover the plurality of protrusions of the organic light emitting layer.

The stacking of the organic light emitting layer on the anode electrode may comprise: forming a base layer to a thickness by depositing an organic light emitting material on the anode electrode; preparing a porous mask, in which a plurality of pores are formed through the porous mask, on the base layer; and forming plurality of the protrusions on an upper surface of the base layer by depositing an organic light emitting material through the plurality of pores of the porous mask.

The porous mask may be formed of an aluminium oxide.

A method of manufacturing the porous mask comprises: preparing an aluminum substrate; forming an aluminum oxide layer in which a plurality of pores are formed by anodizing a surface of the aluminium substrate; and separating the aluminium oxide layer from the aluminium substrate. The forming of the aluminium oxide layer may comprise: forming a first aluminium oxide layer in which a plurality of first pores are formed by firstly anodizing the surface of the aluminium substrate; and forming a second aluminium oxide layer in which a plurality of second pores are formed by secondly anodizing the surface of the aluminium substrate after the first aluminium oxide layer is removed.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION OF EXEMPLARY EMBODIMENTS OF THE INVENTION

Figure 1:
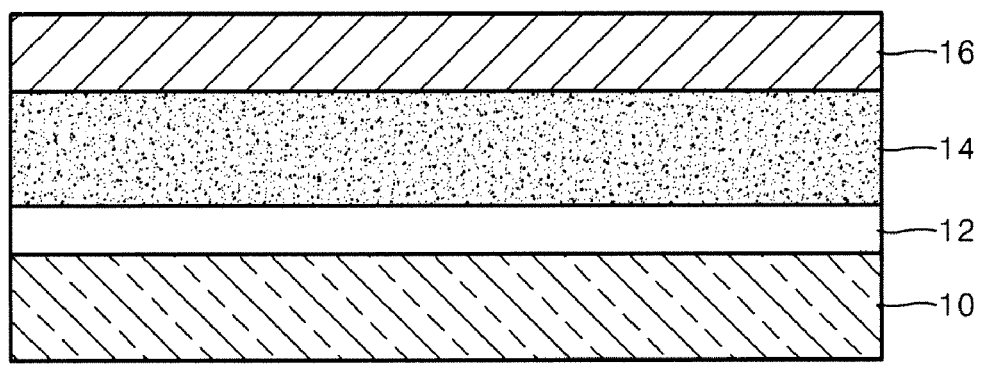
FIG. 1 is cross-sectional view of a related art organic electroluminescent device (OELD)

The present invention will now be described more fully with reference to the accompanying drawings in which exemplary embodiments of the invention are shown. Like reference numerals refer to like elements throughout the drawings. In the drawings, the thicknesses of layers and regions are exaggerated for clarity. Also, when it is described that one layer is formed on a substrate or another layer, the layer may be formed directly on the substrate or another layer, or a third layer may be present between the layer and the substrate or another layer.

Figure 2:
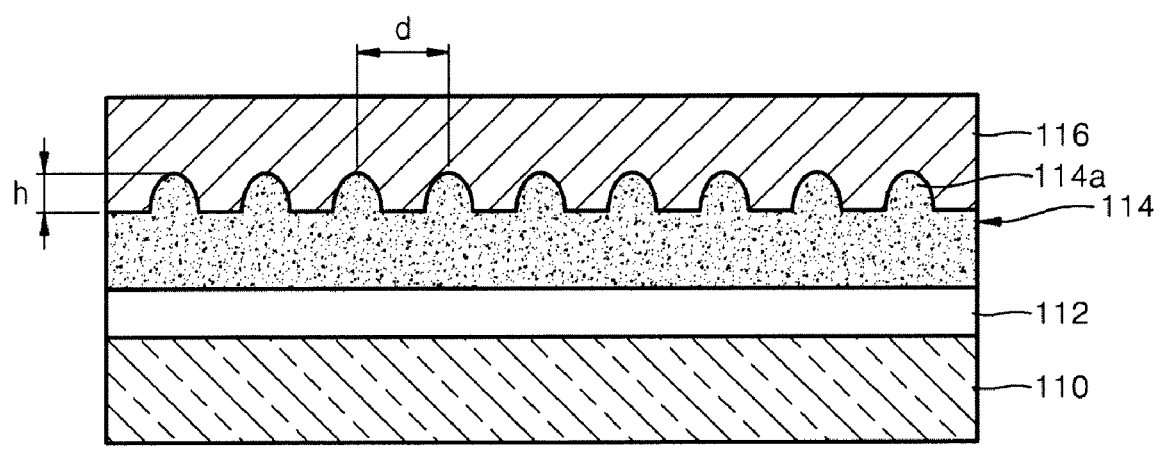
FIG. 2 is a cross-sectional view illustrating an OELD according to an exemplary embodiment of the present invention.
Figure 3:
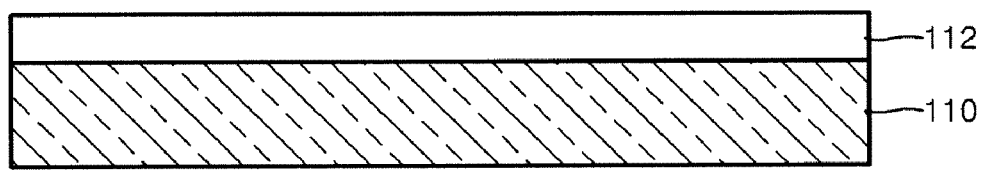
FIGS. 3 through 7 are cross-sectional views illustrating a method of manufacturing an OELD according to an exemplary embodiment of the present invention.

FIG. 2 is a cross-sectional view illustrating an organic electroluminescent device (OELD) according to an exemplary embodiment of the present invention.

Referring to FIG. 2, an anode electrode 112 having a predetermined thickness is stacked on a substrate 110. The substrate 110 can be a transparent glass substrate or a plastic substrate. The anode electrode 112 may be formed of a transparent conductive material, for example, indium tin oxide (ITO). An organic light emitting layer 114 formed of an organic light emitting material is stacked on the anode electrode 112. In the present exemplary embodiment, a plurality of protrusions 114a are formed on the organic light emitting layer 114. The pitch d between the protrusions 114a is determined according to the wavelength of visible light emitted from the organic light emitting layer 114, and may be 50 to 600 nm. The height h of the protrusions 114a can be 50 to 600 nm. In the drawing, the protrusions 114a have a hemisphere shape, but the present invention is not limited thereto, that is, the protrusions 114a may have other shapes. Also, the protrusions 114a have a symmetrical shape, but the present invention is not limited thereto, that is, the protrusions 114a may have an asymmetrical shape.

A cathode electrode 116 formed of a metal is formed on the organic light emitting layer 114 on which protrusions 114a are formed. The cathode electrode 116 covers the protrusions 114a. Accordingly, a lower surface of the cathode electrode 116 contacting an upper surface of the organic light emitting layer 114 has a corrugate shape corresponding to the protrusions 114a.

In the OELD having the above mentioned structure, when a predetermined voltage is applied between the anode electrode 112 and the cathode electrode 116, visible light is emitted from the organic light emitting layer 114 by combining holes supplied from the anode electrode 112 and electrons supplied from the cathode electrode 116 in the organic light emitting layer 114. The visible light emitted externally through the transparent anode electrode 112 and the substrate 110 displays images. In the present exemplary embodiment, the protrusions 114a on the upper part of the organic light emitting layer 114 are formed at intervals, and the cathode electrode 116, which is formed of a metal, is formed to cover the protrusions 114a. Accordingly, the interface between the organic light emitting layer 114 and the cathode electrode 116 has a corrugate shape corresponding to the protrusions 114a. In this case, a portion of visible light that is emitted from the organic light emitting layer 114 and which travels towards the cathode electrode 116, which is formed of a metal, is re-reflected towards the organic light emitting layer 114 due to excitations of surface plasmon at an interface between the cathode electrode 116 and the organic light emitting layer 114. In a related art OELD, in which the organic light emitting layer 14 and the cathode electrode 16 are stacked in a flat planar structure, a portion of visible light that is emitted from the organic light emitting layer 14 and travels towards the cathode electrode 16 is absorbed as heat. However, in an OELD according to an exemplary embodiment of the present invention, the interface between the organic light emitting layer 114 and the cathode electrode 116 has a regularly corrugated shape. Therefore, a portion of visible light that is emitted from the organic light emitting layer 114 and travels towards the cathode electrode 116 is emitted externally through the anode electrode 112 and the substrate 110 by reflecting at the organic light emitting layer 114. Accordingly, the OELD according to an exemplary embodiment of the present invention has a lesser loss of visible light emitted from the organic light emitting layer 114 than the related art OELD, thereby increasing luminance efficiency. Also, the OELD according to an exemplary embodiment of the present invention can reduce input energy as compared with the related art OELD, thereby increasing lifetime of the OELD.

A method of manufacturing an OELD illustrated in FIG. 2 according to an exemplary embodiment of the present invention will now be described. FIGS. 3 through 7 are cross-sectional views illustrating a method of manufacturing an OELD according to an exemplary embodiment of the present invention.

Referring to FIGS. 3 through 7, a substrate 110 is prepared. The substrate 110 can be a related art transparent glass substrate or a plastic substrate. An anode electrode 112 having a predetermined thickness is formed on the substrate 110. The anode electrode 112 can be formed on the substrate 110 by depositing a transparent conductive material such as indium tin oxide (ITO).

Figure 4:
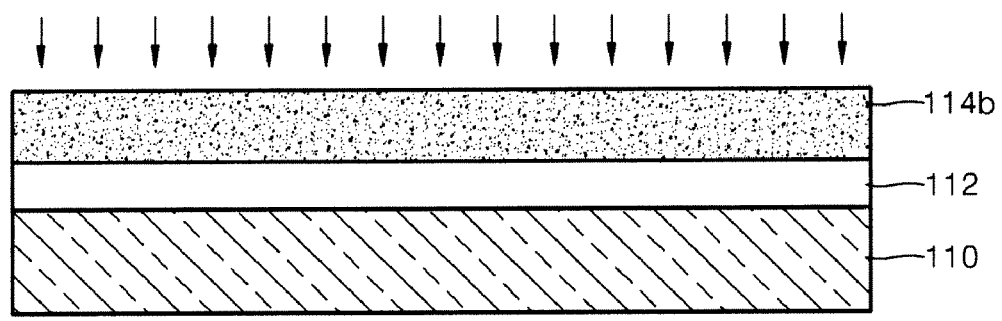
Figure 6:
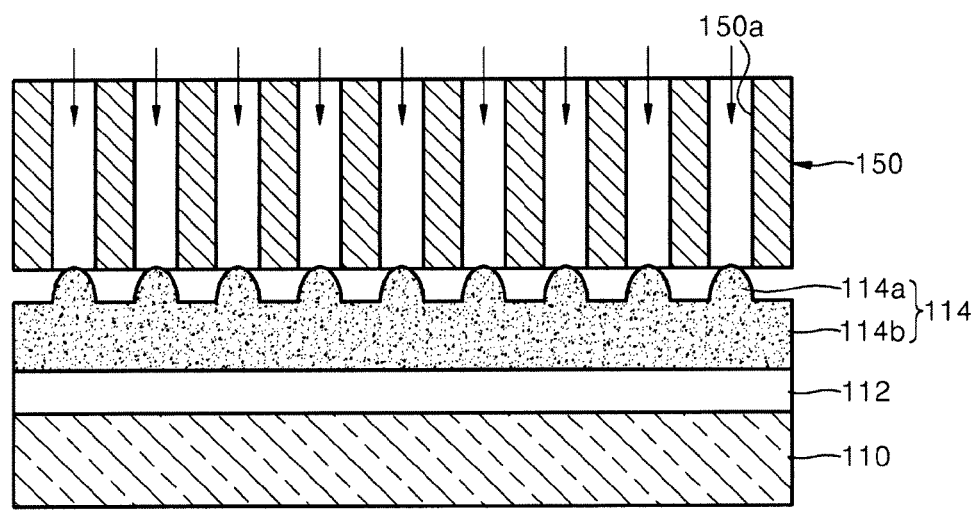

Referring to FIG. 4, a base unit 114b of an organic light emitting layer 114, as illustrated in FIG. 6, is formed on the anode electrode 112. The base unit 114b can be formed on the anode electrode 112 by depositing an organic material to a predetermined thickness. The thickness of the base unit 114b formed on the anode electrode 112 may be approximately ⅔ of the thickness of the organic light emitting layer 114 in the related art OELD.

Figure 5:
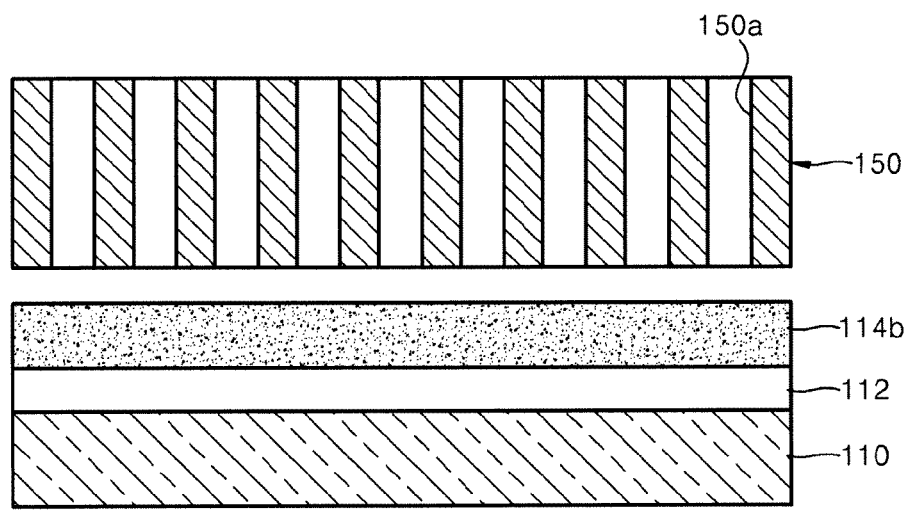

Referring to FIG. 5, a porous mask 150 is prepared above the base unit 114b. The porous mask 150 includes a plurality of pores 150a formed at intervals and penetrating the porous mask 150. The size of the pores 150a formed in the porous mask 150 must be larger than the plurality of protrusions 114a, illustrated in FIG. 6. Also, the porous mask 150 must be installed at a distance from the base unit 114b because the pores 150a must not be blocked by an organic light emitting material which will be deposited in a subsequent deposition process of the organic light emitting material.

Figure 8:
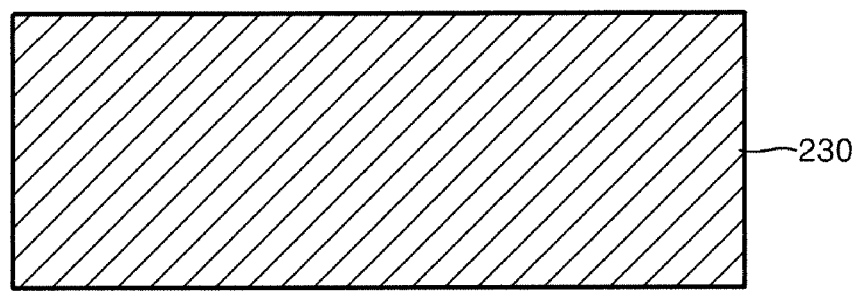
FIGS. 8 through 11 are cross-sectional views illustrating a method of manufacturing a porous mask used for manufacturing an OELD according to an exemplary embodiment of the present invention.
Figure 9:
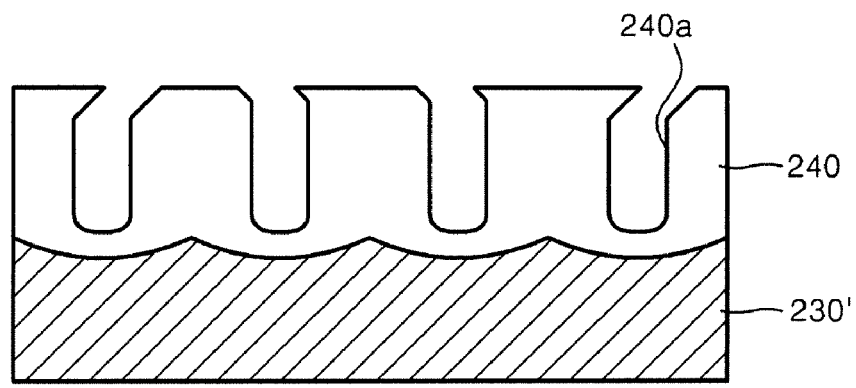
Figure 10:
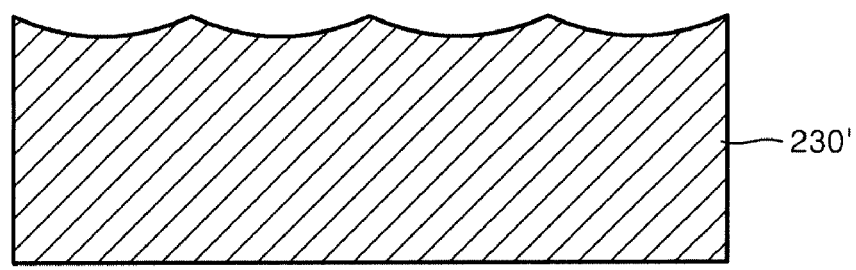
Figure 11:
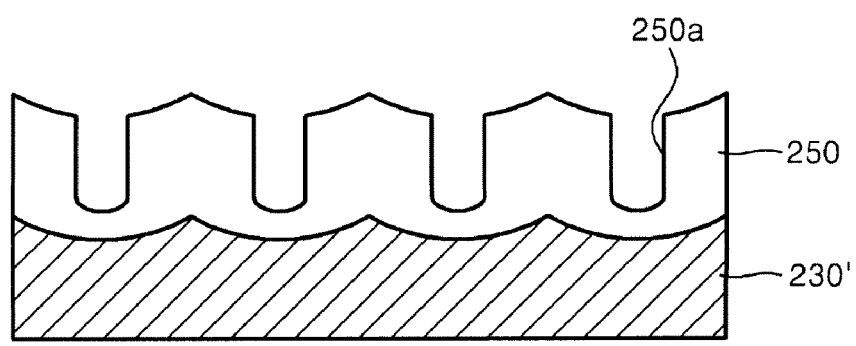
Figure 12:
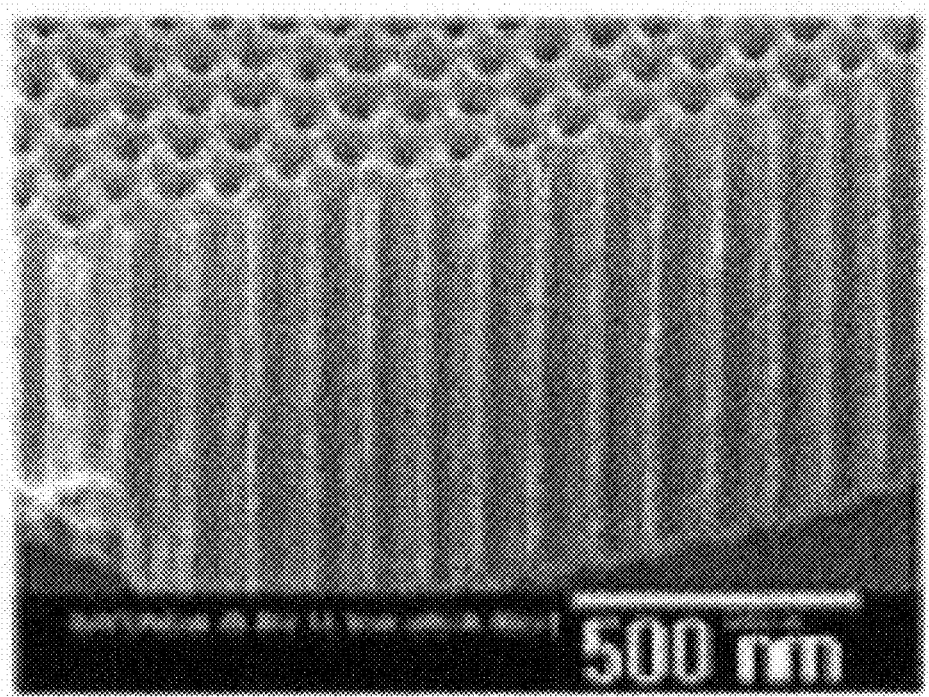
FIG. 12 is a photograph illustrating a porous mask manufactured using the method described with reference to FIGS. 8 through 11, according to an exemplary embodiment of the present invention.

In the present exemplary embodiment, the porous mask 150 can be formed of an aluminium oxide. FIGS. 8 through 11 are cross-sectional views illustrating a method of manufacturing a porous mask used for manufacturing an OELD according to an exemplary embodiment of the present invention. Referring to FIG. 8, an aluminium substrate 230 is prepared. Referring to FIG. 9, a first aluminium oxide layer 240 is formed on a surface of the aluminium substrate 230' by firstly anodizing the aluminium substrate 230. At this time, a plurality of first pores 240a are formed in the first aluminium oxide layer 240 with irregular shapes. The surface of the aluminium substrate 230', on which the first aluminium oxide layer 240 is formed, has an irregularly corrugated shape. Referring to FIG. 10, the first aluminium oxide layer 240 is removed from the aluminium substrate 230' by etching or the like. Referring to FIG. 11, a second aluminium oxide layer 250 is formed on a corrugated surface of the aluminium substrate 230' by secondly anodizing the aluminium substrate 230' from which the first aluminium oxide layer 240 is removed. In this case, a plurality of second pores 250a are formed in the second aluminium oxide layer 250 with a regularly corrugated shape. When the second aluminium oxide layer 250 in which second pores 250a having a regularly corrugated shape is separated from the aluminium substrate 230', the porous mask 150 as depicted in FIG. 5 is manufactured. FIG. 12 is a photograph illustrating a porous mask manufactured using the method described with reference to FIGS. 8 through 11, according to an exemplary embodiment of the present invention.

Referring to FIG. 6, the plurality of protrusions 114a are formed on an upper surface of the base unit 114b using the porous mask 150 prepared above the base unit 114b. Accordingly, an organic light emitting layer 114 comprised of the base unit 114b and the protrusions 114a is formed on the anode electrode 112. The protrusions 114a can be formed by depositing an organic light emitting material on an upper surface of the base unit 114b through the pores 150a of the porous mask 150. At this time, the pitch of the protrusions 114a is determined according to a wavelength of visible light emitted from the organic light emitting layer 114, and more specifically, the pitch may be 50 to 600 nm. The height of the protrusions 114a may be 50 to 600 nm. In the drawing, the protrusions 114a have a hemisphere shape, but the present invention is not limited thereto, that is, the protrusions 114a may have other shapes. Also, the protrusions 114a have a symmetrical shape, but the present invention is not limited thereto, that is, the protrusions 114a may have an asymmetrical shape.

Figure 7:
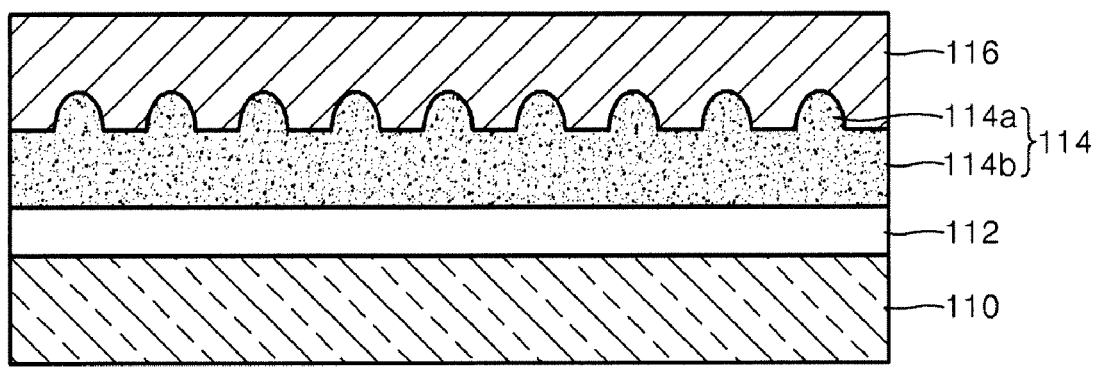

Referring to FIG. 7, after the porous mask 150 in FIG. 6 is removed and when the cathode electrode 116 formed of a metal is formed on an upper surface of the organic light emitting layer 114 on which the protrusions 114a are formed, the manufacture of an OELD according to an exemplary embodiment of the present invention is complete. The cathode electrode 116 covering the protrusions 114a can be formed by depositing a metal to a predetermined thickness. Accordingly, a lower surface of the cathode electrode 116 that contacts an upper surface of the organic light emitting layer 114 has a corrugated shape corresponding to the protrusions 114a.

As described above, according to the present invention, in an OELD, visible light that is emitted from an organic light emitting layer and travels towards a cathode electrode can be re-reflected towards the organic light emitting layer by the excitation of surface plasmon due to the formation of protrusions on an upper part of the organic light emitting layer and the cathode electrode covering the upper part of the organic light emitting layer using a metal. Therefore, the loss of visible light emitted from the organic light emitting layer is reduced, thereby increasing luminance efficiency and lifetime of the OELD.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic electroluminescent device (OELD), the method comprising:
   stacking an anode electrode on a substrate;
   forming a base layer to a thickness by depositing an organic light emitting material on the anode electrode;
   preparing a porous mask, in which a plurality of pores are formed through the porous mask, on the base layer;
   forming a plurality of protrusions on an upper surface of the base layer by depositing an organic light emitting material through the plurality of pores of the porous mask positioned over the based layer;
   removing the porous mask;
   stacking a cathode electrode formed of a metal on the base layer and the plurality of protrusions to cover the plurality of protrusions, thereby to form a lower surface of the cathode electrode having a corrugated shape corresponding to the plurality of protrusions.

2. The method of claim 1, wherein the plurality of protrusions are formed to have a pitch of 50 to 600 nm.

3. The method of claim 1, wherein the plurality of protrusions are formed to have a height of 50 to 600 nm.

4. The method of claim 1, wherein the porous mask is formed of an aluminium oxide.

5. The method of claim 1, wherein the substrate is a transparent glass substrate or a plastic substrate.

6. The method of claim 1, wherein the anode electrode is formed by depositing a transparent conductive material on the substrate.

7. The method of claim 1, wherein the cathode electrode is formed by depositing a metal on the base layer and the plurality of protrusions to cover the plurality of protrusions.

8. The method of claim 4, wherein the preparing the porous mask comprises:
   preparing an aluminum substrate;
   forming an aluminum oxide layer in which a plurality of pores are formed by anodizing a surface of the aluminium substrate; and
   separating the aluminium oxide layer from the aluminium substrate.

9. The method of claim 8, wherein the forming of the aluminium oxide layer comprises:
   forming a first aluminium oxide layer in which a plurality of first pores are formed by firstly anodizing the surface of the aluminium substrate; and
   forming a second aluminium oxide layer in which a plurality of second pores are formed by secondly anodizing the surface of the aluminium substrate after the first aluminium oxide layer is removed.

10. The method of claim 9, wherein the transparent conductive material comprises indium tin oxide (ITO).

* * * * *